(12) United States Patent
Ishihara et al.

(10) Patent No.: US 10,253,531 B2
(45) Date of Patent: Apr. 9, 2019

(54) DETECTION SENSOR

(71) Applicant: AISIN SEIKI KABUSHIKI KAISHA, Kariya-shi, Aichi-ken (JP)

(72) Inventors: Koji Ishihara, Anjo (JP); Seika Matsui, Kariya (JP)

(73) Assignee: AISIN SEIKI KABUSHIKI KAISHA, Kariya-shi, Aichi-ken (JP)

( * ) Notice: Subject to any disclaimer, the term of this patent is extended or adjusted under 35 U.S.C. 154(b) by 0 days.

(21) Appl. No.: 15/825,243

(22) Filed: Nov. 29, 2017

(65) Prior Publication Data

US 2018/0163440 A1    Jun. 14, 2018

(30) Foreign Application Priority Data

Dec. 8, 2016 (JP) ................. 2016-238825

(51) Int. Cl.
| | |
|---|---|
| *E05B 81/78* | (2014.01) |
| *E05F 15/44* | (2015.01) |
| *E05F 15/611* | (2015.01) |
| *E05F 15/73* | (2015.01) |
| *G07C 9/00* | (2006.01) |
| *B60J 5/04* | (2006.01) |
| *G01V 3/08* | (2006.01) |
| *B60R 25/01* | (2013.01) |
| *H03K 17/96* | (2006.01) |

(52) U.S. Cl.
CPC ............ *E05B 81/78* (2013.01); *B60J 5/0416* (2013.01); *B60R 25/01* (2013.01); *E05F 15/44* (2015.01); *E05F 15/611* (2015.01); *E05F 15/73* (2015.01); *G01V 3/088* (2013.01); *E05Y 2900/531* (2013.01); *E05Y 2900/546* (2013.01); *G07C 9/0069* (2013.01); *H03K 17/9622* (2013.01)

(58) Field of Classification Search
CPC ........................................................ E05B 81/78
USPC ........................................................ 340/5.72
See application file for complete search history.

(56) References Cited

U.S. PATENT DOCUMENTS

| | | | |
|---|---|---|---|
| 7,911,321 B2 | 3/2011 | Bingle et al. | |
| 2006/0197540 A1* | 9/2006 | Negoro | E05B 81/78 324/690 |
| 2007/0096905 A1* | 5/2007 | Ieda | B60R 25/246 340/562 |
| 2010/0228448 A1* | 9/2010 | Nakakura | E05F 15/43 701/49 |

(Continued)

FOREIGN PATENT DOCUMENTS

| | | |
|---|---|---|
| JP | 2010-236329 A | 10/2010 |
| JP | 2014-194123 A | 10/2014 |

*Primary Examiner* — Santiago Garcia
(74) *Attorney, Agent, or Firm* — Sughrue Mion, PLLC (57) ABSTRACT

A detection sensor includes: a detection electrode that is disposed in at least one of a vehicle door and a periphery of the vehicle door and used for detecting operation of the vehicle door; an area electrode that is disposed in the vehicle door; and a control device that detects an electrostatic capacitance change of the detection electrode and an electrostatic capacitance change of the area electrode, in which the control device performs at least one of determining of detection of an object in a periphery of the detection electrode using the detection electrode, and determining of detection of an object in a periphery of the area electrode using the area electrode depending on an open or closed state of the vehicle door.

16 Claims, 8 Drawing Sheets

(56) References Cited

U.S. PATENT DOCUMENTS

| | | | |
|---|---|---|---|
| 2011/0181387 A1* | 7/2011 | Popelard | B60R 25/246 340/5.2 |
| 2011/0210755 A1* | 9/2011 | Ogawa | H03K 17/955 324/686 |
| 2012/0200388 A1* | 8/2012 | Miura | H03K 17/955 340/5.51 |
| 2017/0241187 A1* | 8/2017 | Takayanagi | E05F 15/75 |

* cited by examiner

DETECTION SENSOR

CROSS REFERENCE TO RELATED APPLICATIONS

This application is based on and claims priority under 35 U.S.C. § 119 to Japanese Patent Application 2016-238825, filed on Dec. 8, 2016, the entire contents of which are incorporated herein by reference.

TECHNICAL FIELD

This disclosure relates to a detection sensor mounted on at least one of a vehicle door and a periphery of the vehicle door.

BACKGROUND DISCUSSION

As the detection sensor mounted on the vehicle door, a technology described in JP 2010-236329A (Reference 1), is known.

The detection sensor described in Reference 1 detects an obstacle and avoids contact between the vehicle door and a person or another vehicle.

However, the usage of a detection sensor in the related art is limited. Therefore, it is necessary to provide. Therefore, it is necessary to provide a plurality of detection sensors according to the respective uses on the vehicle. For example, for the purpose of avoiding contact with an obstacle, a detection sensor for detecting the obstacle is attached to a vehicle door. The detection sensor for detecting a hand is attached to the vehicle door for the purpose of enabling an operation of the vehicle door by detection of the hand. However, when the vehicle door becomes multi-functional, the number of detection sensors increases accordingly, which may be lacking in the space to install the detection sensors. Thus, a need exists for a detection sensor which is not susceptible to the drawback mentioned above.

SUMMARY

A detection sensor according to an aspect of this disclosure Includes a detection electrode that is disposed in at least one of a vehicle door and a periphery of the vehicle door and used for detecting operation of the vehicle door; an area electrode that is disposed in the vehicle door; and a control device that detects an electrostatic capacitance change of the detection electrode and an electrostatic capacitance change of the area electrode, in which the control device performs at least one of determining of detection of an object in a periphery of detection electrode using the detection electrode, and determining of the detection of an object in a periphery of the area electrode using the area electrode depending on an open or closed state of the vehicle door.

(5) A detection sensor according to another aspect of this disclosure includes a plurality of detection electrodes that are used for detecting operation of a vehicle door; and a control device that detects an electrostatic capacitance change of the detection electrode, in which the plurality of the detection electrodes are arranged at different positions in a vehicle.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

First Embodiment

A detection sensor will be described with reference to FIG. 1 to FIG. 6.

In the following description, an "up-and-down direction" of a vehicle 1 indicates a direction along the vertical direction when the vehicle 1 is disposed on a flat ground.

Figure 1:
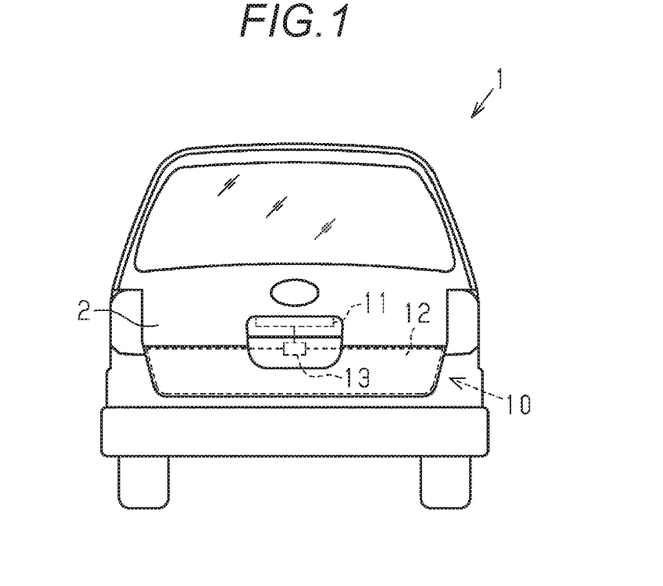
FIG. 1 is a rear view of a vehicle having a detection sensor according to a first embodiment.

A detection sensor 10 detects an object disposed around the detection sensor 10. The detection sensor 10 includes an electrostatic capacitance sensor. For example, an object of a detection target is an obstacle such as a wall and a human (including part of human).

The detection sensor 10 is mounted at a vehicle door 2 (rear door in the present embodiment) and in the periphery of the vehicle door 2. The detection sensor 10 includes a plurality of electrodes for detecting electrostatic capacitance change and a control device 13. In the present embodiment, the detection sensor 10 includes two electrodes.

One electrode (hereinafter, "detection electrode 11") is disposed on at least one in the periphery of the vehicle door 2 and the vehicle door 2. For example, the detection electrode 11 is disposed in an intermediate portion of the vehicle door 2 in the up-and-down direction. The detection electrode 11 is provided for detection of a human's operation. For example, the detection electrode 11 is configured with a conductive substrate. A detection area A1 of the detection electrode 11 is limited to the vicinity of the detection electrode 11. Under a condition where an object is detected when the object is disposed in the vicinity of the detection electrode 11, detection of an object other than the operation is suppressed. When the detection area A1 is wide, various objects (for example, tree branches) are likely to enter the area. As a result, since detection frequency of the object becomes high and malfunction easily occurs, the detection area A1 is limited to a narrow range as described above.

Figure 3:
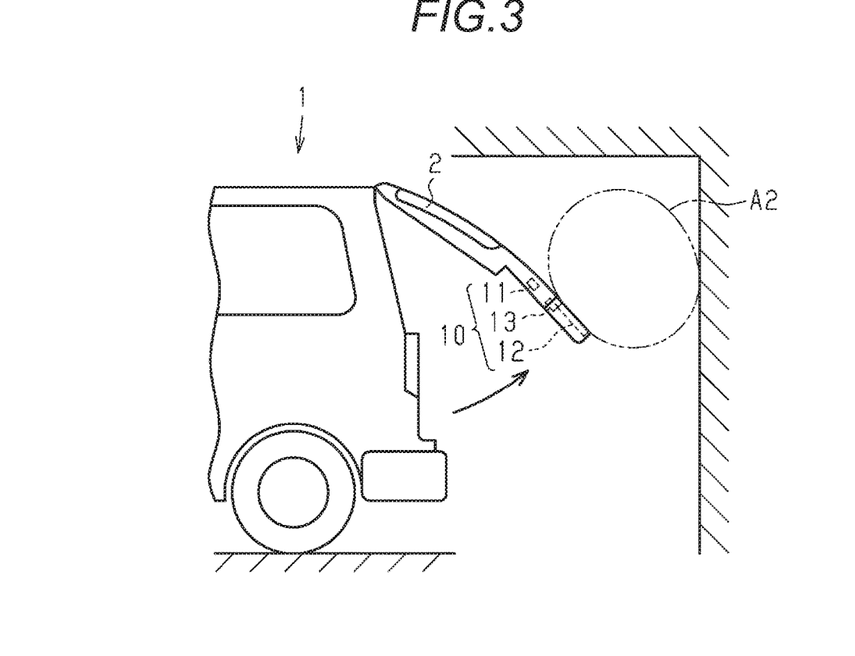
FIG. 3 is a side view of the vehicle illustrating a detection area of the detection sensor when the vehicle door is in an open state.
Figure 5:
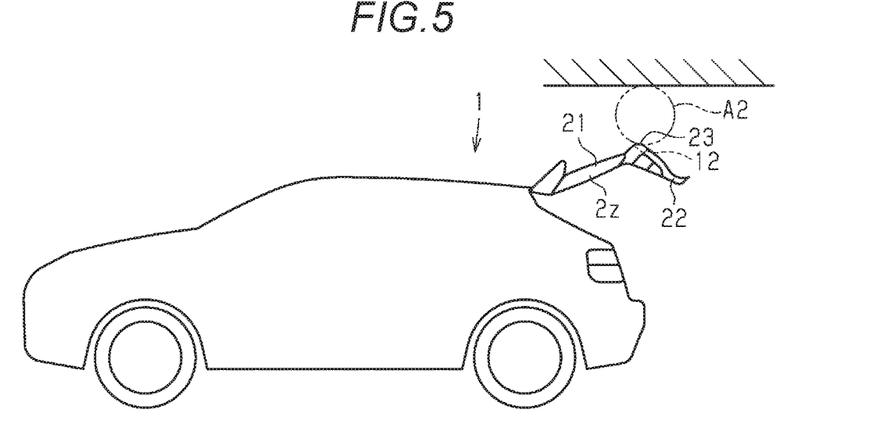
FIG. 5 is a side view of the vehicle illustrating the detection area of the detection sensor when the vehicle door is in the open state with respect to other forms of the vehicle door.

As illustrated in FIG. 3 or FIG. 5, the other electrode (hereinafter, "area electrode 12") is disposed at a portion closest to the rear wall during opening of the door or at a position closest to the ceiling when the door is fully open. In an example of the vehicle door 2 illustrated in FIG. 3, the area electrode 12 includes a detection area A2 wider than that of the detection electrode 11. The area electrode 12 is provided for detecting the obstacle. For example, the area electrode 12 includes a metal wire. For example, the metal wire as the area electrode 12 is wired along a resin portion of a peripheral edge of the vehicle door 2. The area electrode 12 may be configured as a linear shape, a ring shape, a net shape, or a branch shape, not branched. When the area electrode 12 includes the metal wire, there is a merit that the degree of freedom in a shape of the area electrode 12 is high and wiring in the vehicle door 2 is easily implemented.

The control device 13 switches two detections of detection (hereinafter, "first detection") of the electrostatic capacitance change using the detection electrode 11 and detection (hereinafter, "second detection") of the electrostatic capacitance change using the area electrode 12 according to the open or closed state of the vehicle door 2.

Figure 2:
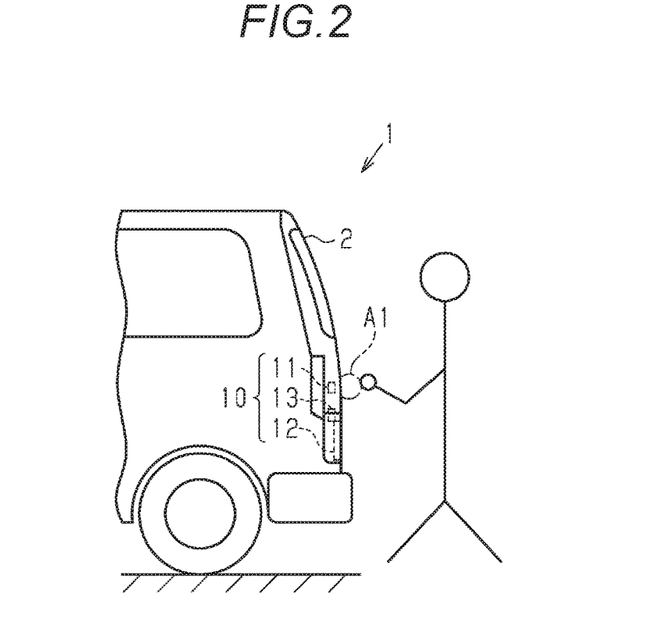
FIG. 2 is a side view of the vehicle illustrating a detection area of the detection sensor when the vehicle door is in a closed state.

As illustrated in FIG. 2, when the vehicle door 2 is in the closed state, the control device 13 performs the first detection. Electrostatic capacitance of the detection electrode 11 can be influenced by the electrostatic capacitance change of the area electrode 12. When the vehicle door 2 is in the fully closed state, since the influence is suppressed, the area electrode 12 is connected to the ground or the area electrode 12 is electrically disconnected from the control device 13.

As illustrated in FIG. 3, when the vehicle door 2 is in the open state, the control device 13 performs the second detection. The electrostatic capacitance of the area electrode 12 can be influenced by the electrostatic capacitance change of the detection electrode 11. When the vehicle door 2 is in the open state, since the influence is suppressed, the detection electrode 11 is connected to the ground or the detection electrode 11 is electrically disconnected from the control device 13.

Figure 4:
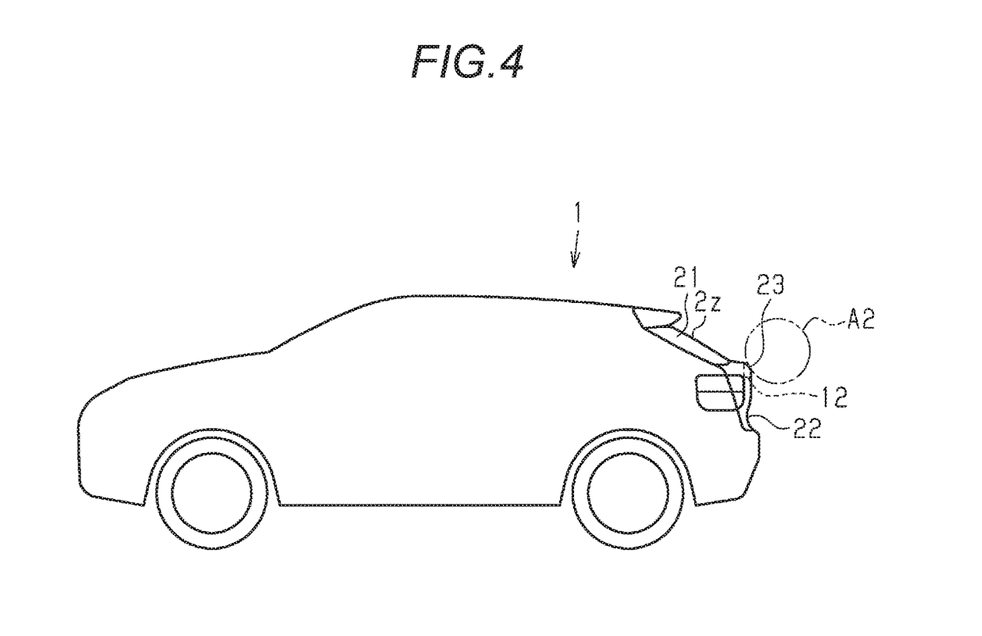
FIG. 4 is a side view of the vehicle illustrating the detection area of the detection sensor when the vehicle door is in the closed state with respect to other forms of the vehicle door.

FIG. 4 and FIG. 5 illustrate a rear door of a shape different from that of the rear door illustrated in FIG. 1 and FIG. 2.

The vehicle door 2 in FIG. 1 and FIG. 2 extends downward from a door spindle on a roof side. A vehicle door 2z (rear door) of FIG. 4 and FIG. 5 includes an inclined portion 21 inclined downward while heading back from the door spindle on the roof side and a hanging portion 22 hanged downward by being bent from the inclined portion 21. In the vehicle door 2z including the inclined portion 21 and the hanging portion 22, the detection electrode 11 and the area electrode 12 are arranged in a bent portion 23 between the inclined portion 21 and the hanging portion 22 or around the bent portion 23. The reason for this arrangement is as follows. That is, it is based on two reasons that first, as illustrated in FIG. 4, when the door is fully close, the bent portion 23 is disposed at an appropriate height for easy operation, and second, as illustrated in FIG. 5, when the door is fully open, the bent portion 23 is disposed at the highest position. In FIG. 4 and FIG. 5, the detection electrode 11 and the control device 13 are omitted from the drawings.

Figure 6:
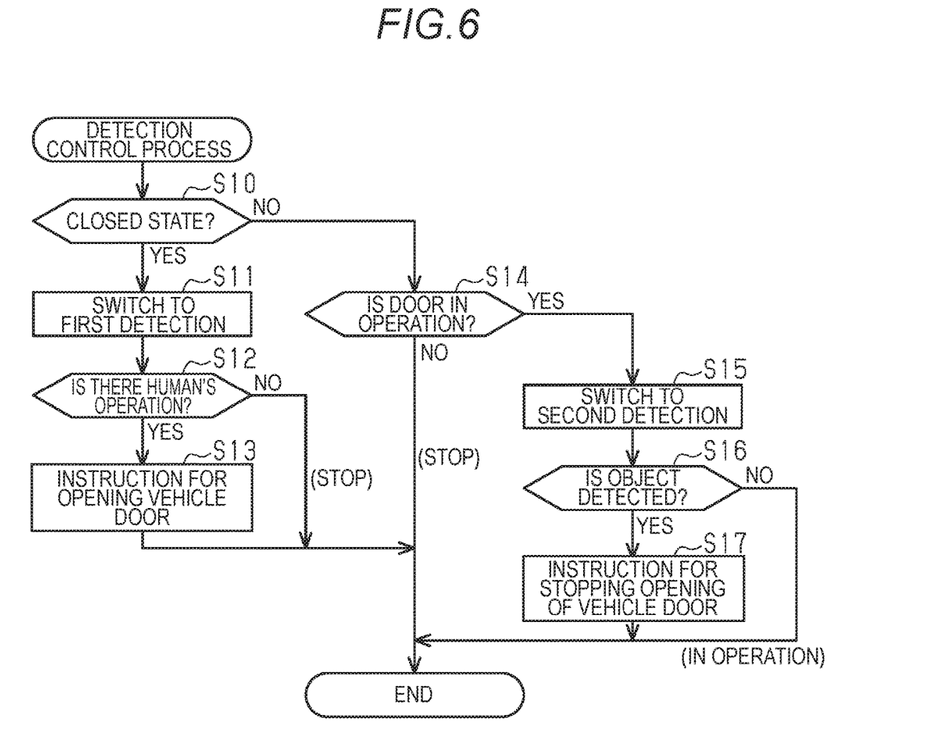
FIG. 6 is a flowchart of a detection control process performed by a control device.

With reference to FIG. 6, a detection control process performed by the control device 13 will be described.

In step S10, in the detection control process, it is determined whether or not the vehicle door 2 is in the closed state. This determination is performed based on information output from a door control device mounted on the vehicle 1 or performed based on an output signal of a sensor for detecting the open or closed state of the vehicle door 2. When the vehicle door 2 is in the closed state, the process proceeds to next step S11. When the vehicle door 2 is in the open state, the process proceeds to step S14.

In step S11, the process of the control device 13 is switched to the first detection, and proceeds to step S12.

In step S12, the control device 13 determines whether or not a human's operation is detected by the first detection. This determination is performed based on whether or not physical quantity based on the electrostatic capacitance change of the detection electrode 11 or magnitude of the electrostatic capacitance is within a specified range. For example, as the physical quantity, there are the magnitude of the electrostatic capacitance, potential of the detection electrode 11, measurement amount of the change of electrostatic capacitance or change of the potential, and the like. The specified range is a value obtained based on the physical quantity when a human's operation is detected, and is set in advance. In the determination of step S12, when it is determined that the human's operation is detected, the control device 13 outputs an instruction for opening the vehicle door 2 in step S13. This instruction is output to the door control device or a driving device of the vehicle door 2. In the determination of step S12, when it is determined that the human's operation is not detected, the control device 13 does not output the instruction. Therefore, the vehicle door 2 is maintained in the closed state.

The process of step S14 in the determination of the above-described step S11 is performed when it is determined that the vehicle door 2 is not in the closed state. In step S14, the control device 13 determines whether or not the vehicle door 2 is in operation. In this determination, when it is determined that the vehicle door 2 is in operation, the process proceeds to next step S15.

In step S15, the process of the control device 13 is switched to the second detection, and proceeds to next step S16.

In step S16, the control device 13 determines whether or not an object is detected by the second detection. This determination is performed based on whether or not the physical quantity is within the specified range based on the change of the electrostatic capacitance of the area electrode 12 or the magnitude of the electrostatic capacitance. For example, as the physical quantities, there are the magnitude of the electrostatic capacitance, potential of the area electrode 12, measurement amount of the change of electrostatic capacitance, change of the potential, and the like. The specified range is a value that is obtained based on the physical quantity when an object is detected, and is set in advance. In the determination of step S16, when it is determined that the object is detected, the control device 13 outputs an instruction for stopping or inverting the vehicle door 2 in step S17 (in the present embodiment, it is instruction for stopping, and see FIG. 6). This instruction is output to the door control device or the driving device of the vehicle door 2. In the determination of step S16, when it is determined that the object is detected, the control device 13 does not output the instruction. Therefore, the operation of the vehicle door 2 is continued.

In step S14, when it is determined that the vehicle door 2 is not in operation, the instruction is not output. Therefore, the vehicle door 2 is maintained in a stopped state. For example, in the stopped state of the vehicle door 2, the vehicle door 2 can be open and close manually.

An operation and effect of the detection sensor 10 according to the present embodiment will be described.

(1) The detection sensor 10 includes the detection electrode 11 that detects an object disposed on the vehicle door 2, the area electrode 12 disposed on the vehicle door 2, and the control device 13 that detects the electrostatic capacitance change of the detection electrode 11 and the electrostatic capacitance change of the area electrode 12. The control device 13 performs at least one of determining (first detection) of the detection of objects in the periphery of the detection electrode 11 using the detection electrode 11, and determining (second detection) of the detection of objects in the periphery of the area electrode 12 using the area electrode 12 according to the open or closed state of the vehicle door 2. According to this configuration, it is possible to detect other detection target objects according to the open or closed state of the vehicle door 2. That is, the detection sensor 10 is used for various usages.

(2) In the above-described detection sensor 10, when the vehicle door 2 is in the fully closed state, the control device 13 determines that the object in the periphery of the detection electrode 11 is detected using the detection electrode 11, and when the vehicle door 2 is in the open state, the control device 13 determines that the object in the periphery of the area electrode 12 is detected using the area electrode 12. According to this configuration, when the vehicle door 2 is in the fully closed state, since the detection electrode 11 is used in the determination of objects, it is possible to detect the human's operation. When the vehicle door 2 is in the open state, since the area electrode 12 is used, it is possible to detect an obstacle.

(3) In the above-described detection sensor 10, it is preferable that when an open angle of the vehicle door 2 be equal to or smaller than a reference angle, the control device 13 does not perform the detection of the object using the area electrode 12.

When the vehicle door 2 is in the open state and an open angle of the vehicle door 2 is equal to or smaller than the reference angle (that is, it is close to angle of closed state), if the second detection is performed using the area electrode 12, there is a possibility that a door opening portion (opening portion where vehicle door 2 is close) of the vehicle door 2 is detected and the vehicle door 2 is stopped due to the detection. In order to suppress the possibility, a performance range of the second detection is limited by the above-described configuration. For example, in the embodiment, determination of the open angle is performed between step S15 and step S16. When the open angle is greater than the reference angle (when vehicle door 2 is separated from closed state), the process of the control device 13 proceeds to step S16 such that the detection of the object is determined. Meanwhile, when the open angle is equal to or smaller than the reference angle (when vehicle door 2 is close to closed state), the control device 13 does not output an instruction. With this, the vehicle door 2 is smoothly close and open.

Second Embodiment

Figure 7:
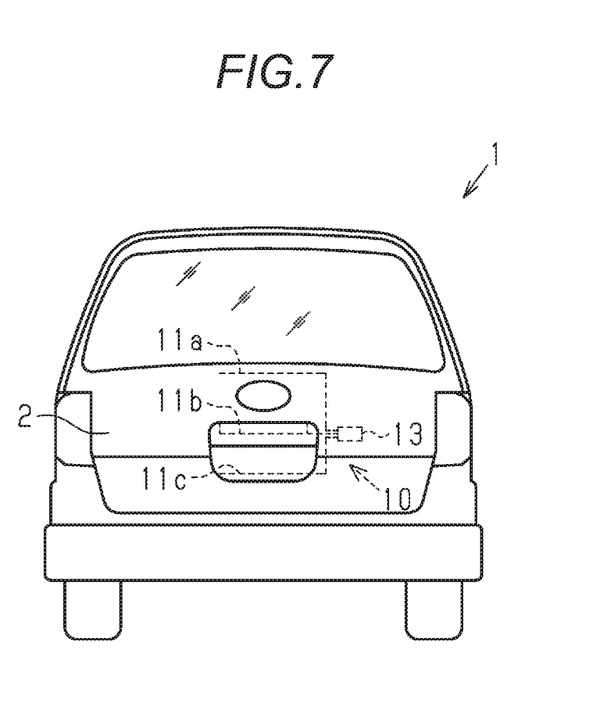
FIG. 7 is a rear view of a vehicle including a detection sensor according to a second embodiment.

The detection sensor 10 according to a second embodiment will be described with reference to FIG. 7. The detection sensor 10 according to the present embodiment includes a plurality of detection electrodes 11a to 11c. The detection sensor 10 may include the area electrode 12 or may omit the area electrode 12.

For example, the plurality of detection electrodes 11a to 11c are arranged in the center portion of the vehicle door 2, and arranged in a row in the up-and-down direction. The reason why the plurality of detection electrodes 11a to 11c are arranged at different heights is to improve usability for a user. Since the detection electrodes 11a to 11c are operation electrodes for detecting an operation when the vehicle door 2 is open, it is desirable that the position is easy for the user to operate. For example, a tall user is convenient when an operation position is at a high position. A short user is convenient when the operation position is at a low position. In order to improve such usability of the user, the detection electrodes 11a to 11c can be selected. The detection electrodes 11a to 11c selected by the user are used for detecting objects (including hand or the like), and the detection electrodes 11a to 11c not selected are not used for detecting the object (including hand or the like).

Figure 8:
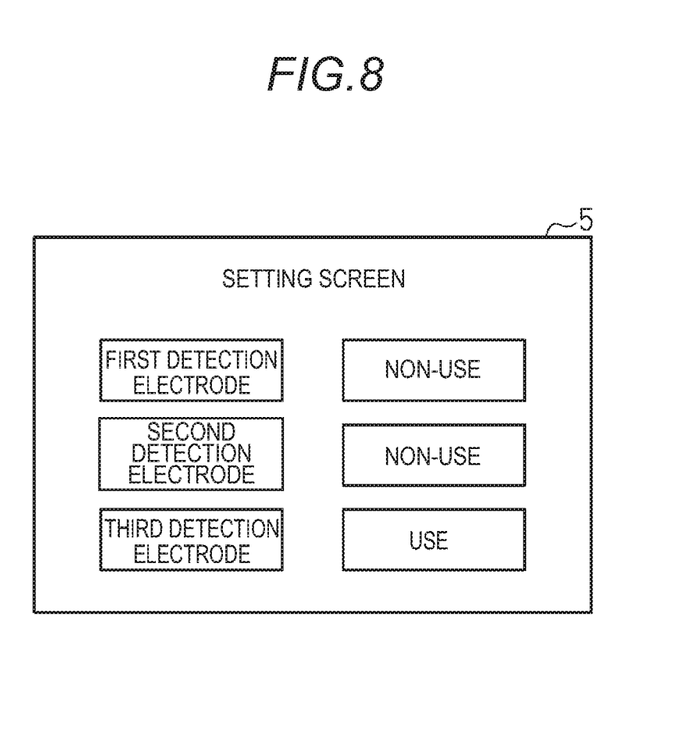
FIG. 8 is a schematic diagram of an operation panel for setting a use state and a non-use state of each electrode of the detection sensor.

As illustrated in FIG. 8, the setting of the detection electrodes 11a to 11c is performed through an operation panel 5 mounted on the vehicle 1. When one of a mark of a first detection electrode 11a, a mark of a second detection electrode 11b, and a mark of a third detection electrode 11c displayed on the operation panel 5 is selected, the selected electrode is set to a use state, and other electrodes are set to a non-use state. The use state indicates a state in which the electrode is used at the time of detection of objects. The non-use state indicates a state in which the electrode is not used at the time of detection of the object.

A setting application for setting the use state or the non-use state with respect to the plurality of detection electrodes 11a to 11c is installed in a computer that communicates with the operation panel 5. Information set in the setting application is displayed on the operation panel 5 connected to the computer. An item set on the operation panel 5 is transmitted to the control device 13 through the computer as an instruction. The control device 13 sets a predetermined detection electrode selected from the plurality of detection electrodes 11a to 11c of the detection sensor 10 based on the instruction to the use state.

An operation and effect of the detection sensor 10 according to the present embodiment will be described.

(1) The detection electrodes 11a to 11c of the detection sensor 10 are arranged at different positions. With this, a position of the detection area for detecting objects can be changed.

(2) In the detection sensor 10, each of the plurality of detection electrodes 11a to 11c can be set to the non-use state or the use state. With this, the position of the detection area can be changed.

(3) It is preferable that the detection sensor 10 include the setting application for setting the use state or the non-use state with respect to the plurality of detection electrodes 11a to 11c. With this, it is possible to simply set the use state or the non-use state with respect to the plurality of detection electrodes 11a to 11c.

Third Embodiment

Figure 9:
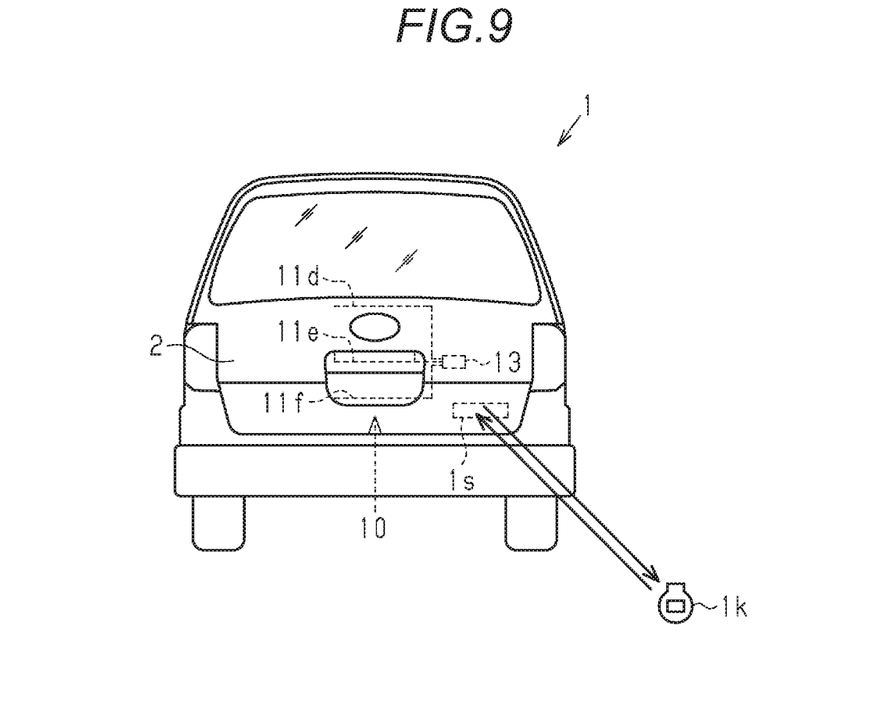
FIG. 9 is a rear view of a vehicle including a detection sensor according to a third embodiment.

The detection sensor 10 according to a third embodiment will be described with reference to FIG. 9. The detection sensor 10 according to the present embodiment includes a plurality of detection electrodes 11d to 11f. The detection sensor 10 can be mounted on the vehicle 1 in which the number of users who can be registered is plural. The detection sensor 10 can set the detection electrodes 11d to 11f to be used by the user for each user. The detection sensor 10 may include the area electrode 12 or the area electrode 12 may be omitted.

In the present embodiment, the vehicle 1 includes an authentication system 1s, and the user can be identified by the authentication system 1s. The authentication system 1s authenticates the user holding an authentication key 1k registered in the vehicle 1. The authentication system 1s communicates with the authentication key 1k, and detects whether or not the user is present within a predetermined range of an authentication area from the vehicle 1. When the authentication is established by communication with the authentication key 1k, the authentication system 1s allows an operation of the vehicle door 2. When the authentication system 1s authenticates the user, user information is obtained. The detection electrodes 11d to 11f to be used by the user are set based on the user information. According to the system, when the user approaches the vehicle 1 and the user is authenticated, a state of one of the detection electrodes 11d to 11f set in advance by the user becomes the use state. A timing at which a state of the detection electrodes 11d to 11f becomes the use state is completed before the user reaches the vicinity of the vehicle door 2. Therefore, the user can operate the vehicle door 2 at a desired position (certain position of detection electrodes 11d to 11f that are set in advance).

Figure 10:
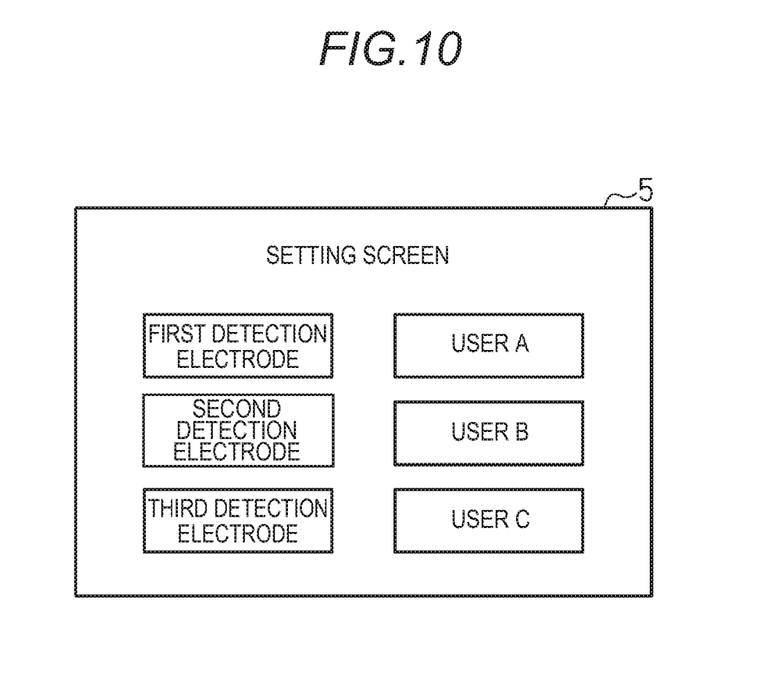
FIG. 10 is a schematic diagram of an operation panel for setting the use state and the non-use state of each electrode of the detection sensor.

As illustrated in FIG. 10, the setting of the detection electrodes 11d to 11f is performed through the operation panel 5 mounted on the vehicle 1. The setting application is operated on the computer provided in the vehicle 1. The information to be set in the setting application is displayed on the operation panel 5 of the computer. An authentication number of the user is set on one of a first detection electrode 11d, a second detection electrode 11e, and a third detection electrode 11f through the operation panel 5. That is, a predetermined detection electrode is associated with the authentication number of the user. The electrode associated with the authentication number is set to the use state and other electrodes are set to the non-use state under a condition where the user is authenticated in the authentication system 1s.

Another example of a setting method of the detection electrodes 11d to 11f will be described with reference to FIG. 11. In this example, the user for the detection electrodes 11d to 11f is set by the user's operation. In a user-settable state which will be described below, the user holds a hand over an arbitrary position in a range where the detection electrodes 11d to 11f are arranged such that one of the detection electrodes 11d to 11f is selected and the selected detection electrode is associated with the authentication number of the user. For example, it is considered that the hand is vertically or horizontally moved and reciprocated at a specific place such that it is operated, as the user's operation.

For example, a setting change button 1p of the detection electrodes 11d to 11f is provided on the authentication key 1k. During a period in which the user is authenticated in the authentication system 1s, when the setting change button 1p is operated as an ON operation, the process of the control device 13 of the detection sensor 10 proceeds to the user-settable state in which the user can be set with respect to the detection electrodes 11d to 11f over a setting changeable time. In the user-settable state, all of the detection electrodes 11d to 11f are set in a state where an object can be detected. When the control device 13 is in the user-settable state, if any one of the detection electrodes 11d to 11f detects an object (for example, human hand), the control device 13 associates the detection electrode that detects the object with the authentication number of the user authenticated by the authentication system 1s.

An operation and effect of the detection sensor 10 according to the present embodiment will be described.

(1) In the above-described detection sensor 10, the use state of the plurality of detection electrodes 11d to 11f is associated in advance with the user information of a plurality of users, and the control device 13 sets the detection electrodes 11d to 11f associated with the user information to the use state based on the user information obtained by the vehicle 1 when the user is within the authentication area of the vehicle 1. According to this configuration, the user can operate the vehicle door 2 at a user's preferred position.

(2) In the above-described detection sensor 10, it is preferable that the setting application for setting an association between the plurality of detection electrodes 11d to 11f and the user information of the plurality of users be provided. With this, the user information can be simply associated with the plurality of detection electrodes 11d to 11f.

Figure 11:
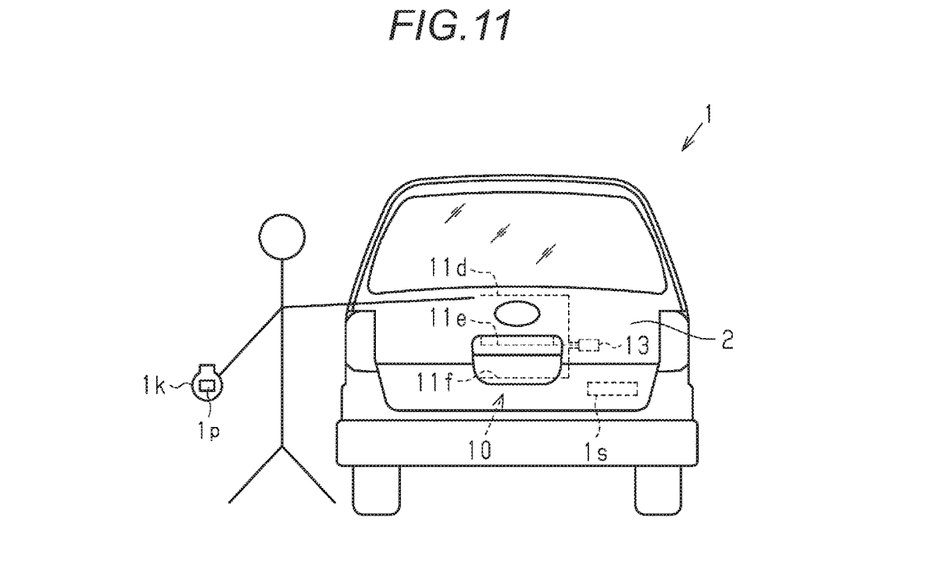
FIG. 11 is a diagram for explaining a method for setting the use state and the non-use state of each electrode of the detection sensor.

(3) In the above-described detection sensor 10, the setting of the use state and the non-use state of the plurality of detection electrodes 11d to 11f may be set by the user's operation (see FIG. 11). As described above, the detection sensor 10 has a setting change state in which association between the plurality of detection electrodes 11d to 11f and the user information of the plurality of users can be changed. When one of the plurality of detection electrodes 11d to 11f detects an object in the setting changeable time, the detection sensor 10 associates detection electrode information (that is, electrode selected by user) with the user information relating to the detection electrode in which a hand operation is detected.

Fourth Embodiment

Figure 12:
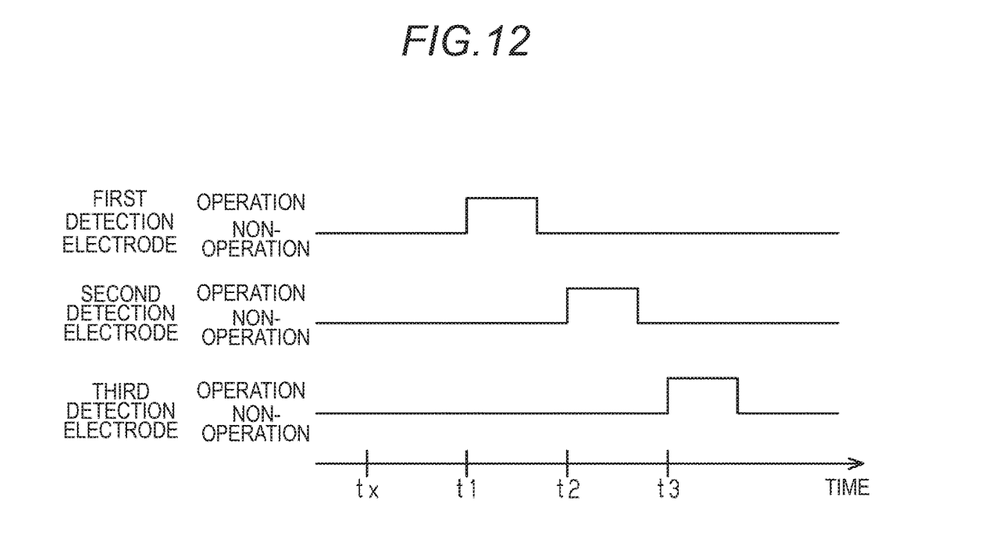
FIG. 12 is an operation timing chart with respect to a detection sensor according to a fourth embodiment.

The detection sensor 10 according to a fourth embodiment will be described with reference to FIG. 12. The detection sensor 10 according to the present embodiment includes the plurality of detection electrodes 11d to 11f. A structure and arrangement of the plurality of detection electrodes 11d to 11f are the same as those of the third embodiment (see FIG. 9). The detection sensor 10 detects the user's operation by operating sequentially the plurality of detection electrodes 11. A technology according to the fourth embodiment can be used in combination with the first embodiment to the third embodiment.

In the present embodiment, the vehicle 1 includes the authentication system 1s and the user is identified by the authentication system 1s. The authentication system 1s authenticates the user holding the authentication key 1k registered in the vehicle 1. The authentication system 1s communicates with the authentication key 1k, and detects whether or not the user is present within a predetermined range of the authentication area from the vehicle 1. When the authentication is established by communication of the authentication key 1k, the authentication system 1s allows an operation of the vehicle door 2.

When the authentication system 1s authenticates the user (time tx in FIG. 12), the detection sensor 10 detects an object (for example, hand) in each of the detection electrodes by operating each of the detection electrodes 11d to 11f in a predetermined order. In the present embodiment, the detection of the object is performed in an order of the first detection electrode 11d, the second detection electrode 11e, and the third detection electrode 11f. That is, in the order, one of the detection electrodes 11d to 11f is switched from the non-use state to the use state. The detection of each of the detection electrodes 11d to 11f is performed within a predetermined period (for example, time shorter than time required from start to completion of human's operation). That is, the positions at which objects are detected in the vehicle door 2 are sequentially different from each other (hereinafter, "sweep of detection"). When an object is detected by any one of the detection electrodes 11d to 11f within a predetermined period, the detection sensor 10 determines that the object is detected, and when no object is detected by any one of the detection electrodes 11d to 11f within a predetermined period, the detection sensor 10 determines that the object is not detected.

An operation and effect of the detection sensor 10 according to the present embodiment will be described.

In the detection sensor 10, the control device 13 sequentially switches the plurality of detection electrodes 11d to 11f from the non-use state to the use state based on information that the user is present in the authentication area of the vehicle 1. With this, it is possible to detect the user's operation. In addition, according to such sweep of detection, the user can operate the vehicle door 2 at a plurality of places. In this manner, the convenience of the user is improved.

Fifth Embodiment

Figure 13:
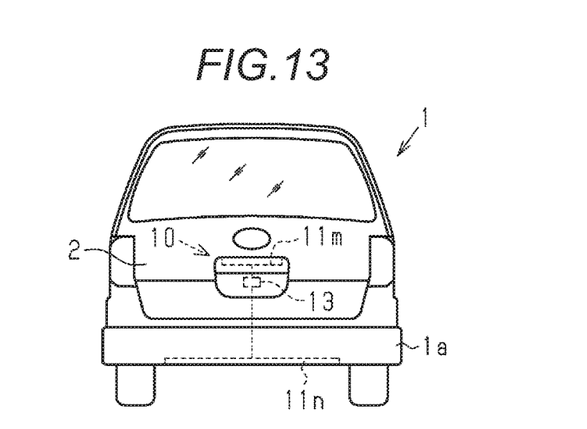
FIG. 13 is a rear view of a vehicle including a detection sensor according to a fifth embodiment.

The detection sensor 10 according to a fifth embodiment will be described with reference to FIG. 13. The detection sensor 10 according to the present embodiment includes a plurality of detection electrodes 11m and 11n. A first detection electrode 11m is disposed in the vehicle door 2, and a second detection electrode 11n is disposed in a lower portion (for example, lower surface of bumper 1a) of a vehicle main body. Which one of the first detection electrode 11m and the second detection electrode 11n is to be used can be set by the user. A setting method is based on the method described in the second embodiment and the third embodiment.

An operation and effect of the detection sensor 10 according to the present embodiment will be described.

According to the above-described configuration, the vehicle door 2 can be operated from the front and the lower side of the vehicle door 2. Specifically, with respect to the opening and closing of the vehicle door 2, either one of a hand operation and a foot operation can be selected.

Sixth Embodiment

Figure 14:
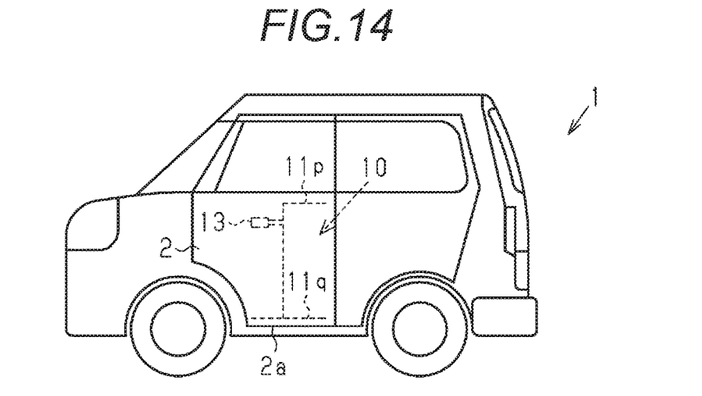
FIG. 14 is a side view of a vehicle including a detection sensor according to a sixth embodiment.

The detection sensor 10 according to a sixth embodiment will be described with reference to FIG. 14. The detection sensor 10 according to the present embodiment includes a plurality of detection electrodes 11p and 11q. A first detection electrode 11p is disposed around a handle of the vehicle door 2 (in present embodiment, side door), and a second detection electrode 11q is disposed in a lower end 2a of the vehicle door 2 or in the periphery of the lower end 2a. It is possible for the user to set which of the first detection electrode 11p and the second detection electrode 11q is used. A setting method is based on a method indicated in the second embodiment and the third embodiment.

According to this configuration, the vehicle door 2 can be operated from the front and the lower side of the vehicle door 2. Specifically, the opening and closing of the vehicle door 2 can be selected by one of a hand operation and a foot operation.

Seventh Embodiment

Figure 15:
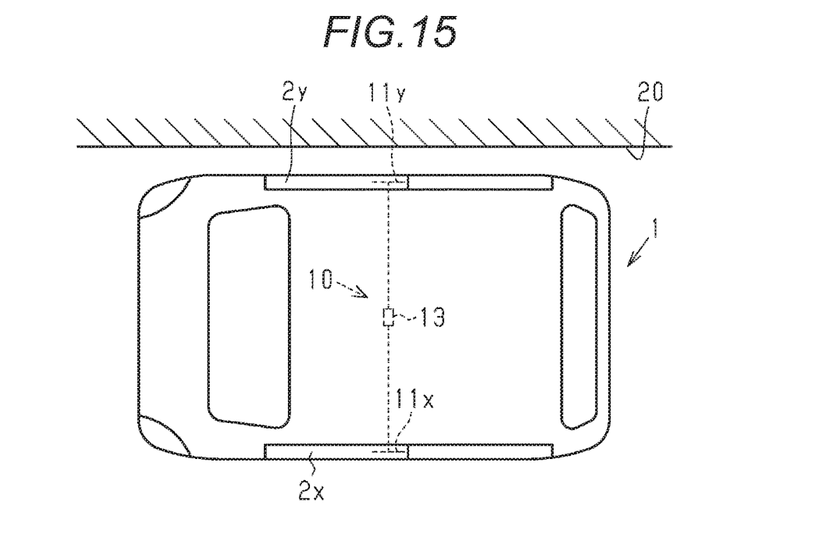
FIG. 15 is a plan view of a vehicle including a detection sensor according to a seventh embodiment.

The detection sensor 10 according to a seventh embodiment will be described with reference to FIG. 15. The detection sensor 10 according to the present embodiment includes a plurality of detection electrodes 11x and 11y. A first detection electrode 11x is disposed in a left side vehicle door 2x (in present embodiment, left side door), and a second detection electrode 11y is disposed in a right side vehicle door 2y (in present embodiment, right side door). It is possible for the user to set which of the first detection electrode 11x and the second detection electrode 11y is used. A setting method is based on a method indicated in the second embodiment and the third embodiment. According to such a detection sensor 10, the vehicle doors 2x and 2y can be selected by being operated based on the detection of the detection sensor 10. For example, as illustrated in FIG. 15, due to a structure of a parking lot with a wall 20 on the right side, there is a case where the right side vehicle door 2y cannot be used on daily getting on and off. The user of the vehicle 1 gets on daily the vehicle through the left side vehicle door 2x. In such a case, when the detection sensor 10 is disposed on only the right side door, the user cannot effectively use the detection sensor 10. In the present embodiment, the detection electrodes 11x and 11y provided in the left side vehicle door 2x and the right side vehicle door 2y can set the use state and the non-use state by selection of the user. When the first detection electrode 11x disposed in the left side vehicle door 2x is set to the use state, the user can effectively use the detection sensor 10.

Another Embodiment

In the first embodiment, when the vehicle door 2 is close, the control device 13 performs the first detection and when the vehicle door 2 is open, the control device 13 performs the second detection. Here, when the vehicle door 2 is open, the first detection and the second detection may be performed at the same time. With this, the detection area can be expended.

In the second embodiment to the seventh embodiment, the detection sensor 10 can obtain the area electrode 12 indicated in the first embodiment. In addition, the detection electrode 11 may be substituted instead of the area electrode 12 that can be added, and a function of the area electrode 12 may be added to the detection electrode 11.

A structure of the area electrode 12 is not limited. For example, the area electrode 12 may be configured with a metal sheet, a rigid substrate, a flexible substrate, a metal wiring, or a composite member of these substrates. In addition, the metal wiring may be a single linear open circuit or may be a loop close circuit.

A structure of the detection electrode 11 is not limited. For example, a metal electrode may be configured with the metal sheet, the rigid substrate, the flexible substrate, the metal wiring, or the composite member of these substrates.

Figure 16:
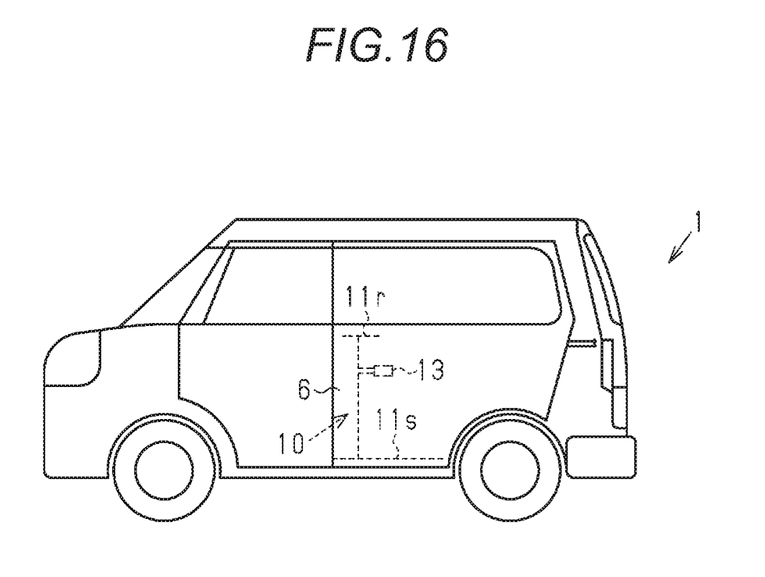
FIG. 16 is a side view of a vehicle including a detection sensor according to another embodiment.
Figure 17:
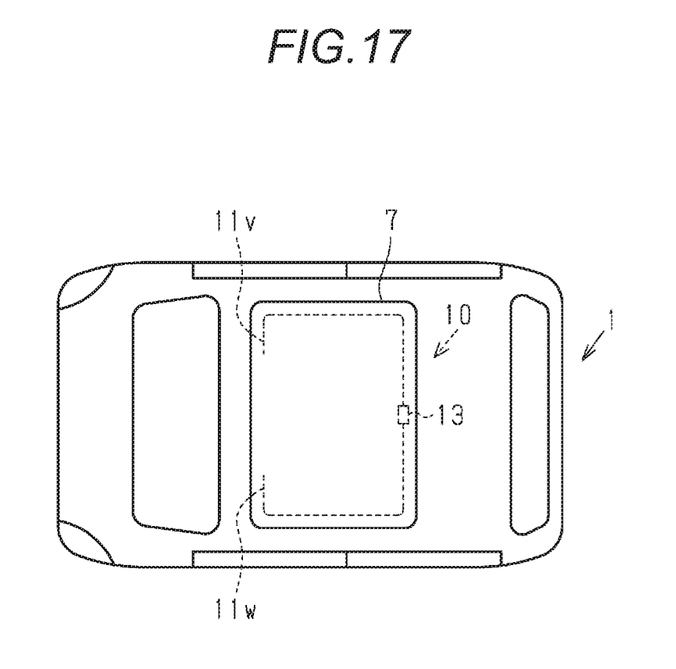
FIG. 17 is a plan view of a vehicle including a detection sensor according to still another embodiment.

The vehicle door 2 is not limited to the rear door and the side door, and may be a sliding door 6 or a roof door 7 illustrated in FIG. 16 and FIG. 17. The detection sensor 10 provided in the sliding door 6 illustrated in FIG. 16 includes a plurality of detection electrodes 11r and 11s. A first detection electrode 11r is disposed around a handle of the sliding door 6 (vehicle door), and a second detection electrode 11s is disposed in the lower end 2a of the sliding door 6 or in the periphery of the lower end 2a (so-called kick position). It is possible for the user to set which one of the first detection electrode 11r and the second detection electrode 11s is used. The detection sensor 10 provided in the roof door 7 (also called a panorama door) illustrated in FIG. 17 includes a plurality of detection electrodes 11v and 11w. For example, a first detection electrode 11v is disposed on the right side (on right side in vehicle advancing direction as front) of the roof door 7 (vehicle door), and a second detection electrode 11w is disposed on the left side (on left side in vehicle advancing direction as front) of the roof door 7. It is possible for the user to set which one of the first detection electrode 11v and the second detection electrode 11w is used.

The periphery of the vehicle door means each pillar (pillar or pillar garnish) and lamp (tail lamp or blinker lamp) on the front and rear sides of the vehicle door or on the left and right sides of the vehicle, a vehicle panel or a rear spoiler on the upper side of the vehicle door, or a vehicle panel, a rocker guard, and a reflection plate on the lower side of the door, or the like.

The periphery of the lower end of the vehicle door means the vehicle panel, the rocker guard, the bumper, the reflection plate, or the like located on the lower side of the door.

(1) A detection sensor according to an aspect of this disclosure Includes a detection electrode that is disposed in at least one of a vehicle door and a periphery of the vehicle door and used for detecting operation of the vehicle door; an area electrode that is disposed in the vehicle door; and a control device that detects an electrostatic capacitance change of the detection electrode and an electrostatic capacitance change of the area electrode, in which the control device performs at least one of determining of detection of an object in a periphery of detection electrode using the detection electrode, and determining of the detection of an object in a periphery of the area electrode using the area electrode depending on an open or closed state of the vehicle door. According to this configuration, it is possible to made the detection target different according to the open or closed state of the vehicle door. That is, the detection sensor is used for various usages.

(2) In the detection sensor, the control device may determine the detection of the object in the periphery of the detection electrode using the detection electrode when the vehicle door is in a fully closed state and the control device may determine the detection of the object in the periphery of the area electrode using the area electrode when the vehicle door is in an open state. According to this configuration, when the vehicle door is in the fully closed state, since the detection electrode is used in the determination of the object, it is possible to detect the human's operation. When the vehicle door is in the open state, since the area electrode is used, it is possible to detect an obstacle.

(3) In the detection sensor, the control device may not perform the detection of the object using the area electrode when an opening angle of the vehicle door is equal to or smaller than a reference angle.

(4) The detection sensor may include a plurality of the detection electrodes, and the plurality of the detection electrodes may be arranged at different positions. With this configuration, a position of a detection area can be changed based on the detection electrode.

(5) A detection sensor according to another aspect of this disclosure includes a plurality of detection electrodes that are used for detecting operation of a vehicle door; and a control device that detects an electrostatic capacitance change of the detection electrode, in which the plurality of the detection electrodes are arranged at different positions in a vehicle. With this configuration, the position of the detection area can be changed based on the detection electrode.

(6) In the detection sensor, one or some of the plurality of the detection electrodes may be arranged in the vehicle door on a left side of the vehicle and another one or some of the plurality of the detection electrodes may be arranged in the vehicle door on a right side of the vehicle.

(7) In the detection sensor, the plurality of the detection electrodes may be arranged at different positions in a height direction of the vehicle door. With this configuration, the position of the detection area based on the detection electrode can be changed in the height direction.

(8) In the detection sensor, one of the plurality of the detection electrodes may be disposed in the vehicle door and another one of the plurality of the detection electrodes may be disposed in a lower end of the vehicle door or in the periphery of the lower end. According to this configuration, the vehicle door can be operated from the front and the lower side of the vehicle door.

(9) In the detection sensor, each of the plurality of the detection electrodes may be capable of being set to a non-use state or a use state. With this configuration, the position of the detection area can be changed.

(10) The detection sensor may further include a setting application that sets the use state or the non-use state with respect to the plurality of the detection electrodes, in which the setting application may be operated in a computer provided in the vehicle and information to be set in the setting application may be displayed on an operation panel of the computer. With this configuration, it is possible to simply set the use state or the non-use state with respect to the plurality of detection electrodes.

(11) In the detection sensor, the use state of the plurality of the detection electrodes may be associated in advance with user information of a plurality of users, and the control device may set the detection electrode associated with the user information to the use state based on the user information obtained by the vehicle when the user is present in an authentication area of the vehicle.

According to this configuration, the user can operate the vehicle door at a user's preferred position.

(12) The detection sensor may further include a setting application that sets association between the plurality of the detection electrodes and the user information of the plurality of the users, in which the setting application may be operated in a computer provided in the vehicle and information to be set in the setting application is displayed on an operation panel of the computer. With this configuration, the user information can be simply associated with the plurality of detection electrodes.

(13) In the detection sensor, the detection sensor may have a setting change state in which setting of the association between the plurality of the detection electrodes and the user information of the plurality of the users is capable of being changed, and in the setting change state, when one of the plurality of the detection electrodes detects the object in a setting changeable time maintained in the setting change state, the control device may associate the detection electrode that detected the object with the user information. According to this configuration, detection electrode information relating to the selected electrode and the user information can be associated with each other.

(14) In the detection sensor, the control device may sequentially switch the plurality of the detection electrodes from the non-use state to the use state based on information that the user is present in the authentication area of the vehicle. According to this configuration, the user can operate the vehicle door at a plurality of places.

The detection sensor according to the aspect of this disclosure has a plurality of usages.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A detection sensor comprising:
a detection electrode that is disposed in at least one of a vehicle door and a periphery of the vehicle door and used for detecting operation of the vehicle door;
an area electrode that is disposed in the vehicle door, the area electrode is disposed at a portion closest to a rear wall during opening of the vehicle door or at a position closest to a ceiling when the vehicle door is fully open and the area electrode includes a detection area (A2) wider than that of the detection electrode; and
a control device that detects an electrostatic capacitance change of the detection electrode and an electrostatic capacitance change of the area electrode,
wherein the control device determines a human's operation of the detection electrode using the detection electrode when the vehicle door is in a fully closed state and the control device determines an obstacle using the area electrode when the vehicle door is in an open state.

2. The detection sensor according to claim 1,
wherein the control device does not perform the detection of the object using the area electrode when an opening angle of the vehicle door is equal to or smaller than a reference angle.

3. The detection sensor according to claim 1, comprising a plurality of the detection electrodes,
wherein the plurality of the detection electrodes are arranged at different positions.

4. A detection sensor comprising:
a plurality of detection electrodes that are used for detecting operation of a vehicle door;
an area electrode that is disposed in the vehicle door, the area electrode is disposed at a portion closest to a rear wall during opening of the vehicle door or at a position closest to a ceiling when the vehicle door is fully open and the area electrode includes a detection area (A2) wider than that of the detection electrode; and
a control device that detects an electrostatic capacitance change of the detection electrode and an electrostatic capacitance change of the area electrode,
wherein the control device determines a human's operation of a detection electrode of the plurality of detection electrodes using the detection electrode when the vehicle door is in a fully closed state and the control device determines an obstacle using the area electrode when the vehicle door is in an open state,
wherein the plurality of the detection electrodes are arranged at different positions in a vehicle,
wherein each of the plurality of the detection electrodes is capable of being set to a non-use state or a use state,
wherein the use state of the plurality of the detection electrodes is associated in advance with user information of a plurality of users, and
wherein the control device sets the detection electrode associated with the user information to the use state based on the user information obtained by the vehicle when the user is present in an authentication area of the vehicle.

5. The detection sensor according to claim 4,
wherein one or some of the plurality of the detection electrodes are arranged in the vehicle door on a left side of the vehicle and another one or some of the plurality of the detection electrodes are arranged in the vehicle door on a right side of the vehicle.

6. The detection sensor according to claim 3,
wherein the plurality of the detection electrodes are arranged at different positions in a height direction of the vehicle door.

7. The detection sensor according to claim 4,
wherein the plurality of the detection electrodes are arranged at different positions in a height direction of the vehicle door.

8. The detection sensor according to claim 3,
wherein one of the plurality of the detection electrodes is disposed in the vehicle door and another one of the plurality of the detection electrodes is disposed in a lower end of the vehicle door or in the periphery of the lower end.

9. The detection sensor according to claim 4,
wherein one of the plurality of the detection electrodes is disposed in the vehicle door and another one of the plurality of the detection electrodes is disposed in a lower end of the vehicle door or in the periphery of the lower end.

10. The detection sensor according to claim 3,
wherein each of the plurality of the detection electrodes is capable of being set to a non-use state or a use state.

11. The detection sensor according to claim 8, further comprising:
a setting application that sets a use state or a non-use state with respect to the plurality of the detection electrodes,
wherein each of the plurality of the detection electrodes is capable of being set to the non-use state or the use state, and
wherein the setting application is operated in a computer provided in the vehicle and information to be set in the setting application is displayed on an operation panel of the computer.

12. The detection sensor according to claim 8,
wherein each of the plurality of the detection electrodes is capable of being set to a non-use state or a use state,
wherein the use state of the plurality of the detection electrodes is associated in advance with user information of a plurality of users, and
wherein the control device sets the detection electrode associated with the user information to the use state based on the user information obtained by the vehicle when the user is present in an authentication area of the vehicle.

13. The detection sensor according to claim 10, further comprising:
a setting application that sets association between the plurality of the detection electrodes and the user information of the plurality of the users,
wherein the setting application is operated in a computer provided in the vehicle and information to be set in the setting application is displayed on an operation panel of the computer.

14. The detection sensor according to claim 10,
wherein the detection sensor has a setting change state in which setting of the association between the plurality of the detection electrodes and the user information of the plurality of the users is capable of being changed, and
wherein, in the setting change state, when one of the plurality of the detection electrodes detects the object in a setting changeable time maintained in the setting change state, the control device associates the detection electrode that detected the object with the user information.

15. The detection sensor according to claim 3,
wherein each of the plurality of the detection electrodes is capable of being set to a non-use state or a use state, and
wherein the control device sequentially switches the plurality of the detection electrodes from the non-use state to the use state based on information that the user is present in the authentication area of the vehicle.

16. The detection sensor according to claim 4,
wherein the control device sequentially switches the plurality of the detection electrodes from the non-use state to the use state based on information that the user is present in the authentication area of the vehicle.

* * * * *